United States Patent [19]

Hutcheon

[11] 4,389,572

[45] Jun. 21, 1983

[54] TWO MAGNET ASYMMETRIC DOUBLY ACHROMATIC BEAM DEFLECTION SYSTEM

[75] Inventor: Ronald M. Hutcheon, Deep River, Canada

[73] Assignee: Atomic Energy of Canada Limited, Ottawa, Canada

[21] Appl. No.: 246,872

[22] Filed: Mar. 23, 1981

[30] Foreign Application Priority Data

Jun. 4, 1980 [CA] Canada .................................. 353640

[51] Int. Cl.[3] ............................................ H01J 37/147

[52] U.S. Cl. ......................... 250/396 R; 250/396 ML

[58] Field of Search ........... 250/396 R, 396 ML, 296, 250/297

[56] References Cited

U.S. PATENT DOCUMENTS

| | | | |
|---|---|---|---|
| 3,135,863 | 6/1964 | Hunt | 250/396 R |
| 3,541,328 | 11/1970 | Enge | 250/396 R |
| 3,691,374 | 9/1972 | Leboutet | 250/396 R |
| 3,867,635 | 2/1975 | Brown et al. | 250/396 R |

OTHER PUBLICATIONS

"Effect of Extended Fringing Fields on Ion-Focusing Properties of Deflecting Magnets", Enge, *Review of Sci. Ins.,* Mar. 1964, pp. 278-287, vol. 35, No. 3.

*Primary Examiner*—Bruce C. Anderson
*Attorney, Agent, or Firm*—Edward Rymek

[57] ABSTRACT

The beam deflection system includes two dipole magnets for deflecting a charged particle beam in a deflection plane. The first magnet bends the beam in a path having a radius $\rho_1$ and a deflection angle $\theta_1$ greater than 180°. The first magnet has an effective exit edge at an angle $(90°-\eta_1)$ with respect to the beam path. The second magnet further bends the beam in a path having a radius $\rho_2$ and a deflection angle $\theta_2$ where $225° \leq (\theta_1+\theta_2) \leq 280°$. The effective entry edge of the second magnet is at an angle of $(90°-\eta_2)$ to the beam path. In the usual practical case the effective interior edges of the two magnets are roughly parallel, that is, $\eta_1 \approx -\eta_2$ and the doubly achromatic properties are obtained to first order when the angles satisfy the following formula:

$$\eta_1 \approx -\eta_2$$

$$2\eta_2 \approx \theta_2 - (\theta_1 - 180°),$$

and when the distance D between the effective edges of the two magnets is set so that the dipoles produce equal beam dispersion in the drift distance between them. For the case of 270° total bend with $\rho_2 = \rho_1$ this occurs at a distance D, given by $$D = \rho_1 \frac{(1 + \cos 2\eta_2)}{(1 + 1.414 \sin \eta_2)}.$$

6 Claims, 4 Drawing Figures

TWO MAGNET ASYMMETRIC DOUBLY ACHROMATIC BEAM DEFLECTION SYSTEM

BACKGROUND OF THE INVENTION

This invention is directed to a beam deflection system for bending a charged particle beam and focusing it onto a target, and in particular it is directed to a doubly achromatic, double focusing magnet system.

In present therapy electron accelerators, it is usually necessary to have a bending magnet system which will bend an accelerator beam approximately 90° onto a target. The geometry must be acceptably compact for a range of electron energies between 5 and 25 MeV. This geometry usually requires that the beam be bent back across itself resulting in a beam being deflected at an angle from 225° to 280°.

Because of the broad energy spread of the electrons in the beam and the restrictions required on beam divergence angle on a target, a doubly achromatic system is necessary. In the Review of Scientific Instruments, Vol. 34, page 385, 1963, H. A. Enge describes a single magnet system which is doubly achromatic for bending a beam 270°. However, this system would be difficult to manufacture and requires very accurate field mapping and shimming.

Standard doubly achromatic, double focusing systems are based on having a mirror plane of symmetry halfway through the magnet system. Examples of symmetric three-magnet systems are described in U.S. Pat. No. 3,691,374 which issued to Leboutet on Sept. 12, 1972; and U.S. Pat. No. 3,867,635 which issued to Brown et al on Feb. 18, 1975. An example of a four-magnet 180° system is described in U.S. Pat. No. 3,967,225 which issued to E. A. Heighway on June 29, 1976. These systems have been found to have relatively large orbit dimensions, i.e. the perpendicular distance or height of the magnet system above the projected input axis.

SUMMARY OF THE INVENTION

It is therefore an object of this invention to provide a bending magnet system in which the beam orbit dimension is minimized.

This and other objects of the invention are achieved in a magnetic beam deflection system having a first and a second dipole magnet.

The first dipole magnet deflects the beam in a plane along a path having a bending radius $\rho_1$ and a bending angle $\theta_1$ greater than 180° and less than 225°. The first magnet has an effective exit edge at an angle $(90° - \eta_1)$ with respect to the beam path at exit. The second dipole magnet further deflects the beam in the plane along a path having a bending radius $\rho_2$ and a bending angle $\theta_2$ of less than 90°. The second magnet has an effective entry edge at an angle $(90 - \eta_2)$ with respect to the beam path, where $\eta_1 \approx -\eta_2$. The first magnet's effective exit edge is a drift distance D from the second magnet's effective entry edge, wherein D is selected to match the first and second dipole magnets' dispersions in the drift region.

The total deflection of the system may be greater than 225° but less than 280° and the inside edges of the dipoles will preferably be at an angle $\eta_2 \approx \eta_1$ where $\eta_2$ or $\eta_1$ are in the order of $$\frac{\theta_2 - (\theta_1 - 180°)}{2}.$$

In a compact bending magnet system for deflecting the beam through an angle in the order of 270°, $\rho_2$ will normally be substantially equal to $\rho_1$ and the drift distance D will, therefore, preferably be equal to $$\rho_1 \frac{(1 + \cos 2\eta_2)}{\left(1 + \frac{\sin \eta_2}{\sin 45°}\right)}$$

and $\theta_2 - \eta_2$ will preferably be in the order of 45°.

Many other objects and aspects of the invention will be clear from the detailed description of the drawings.

DETAILED DESCRIPTION OF THE EMBODIMENTS

Figure 1:
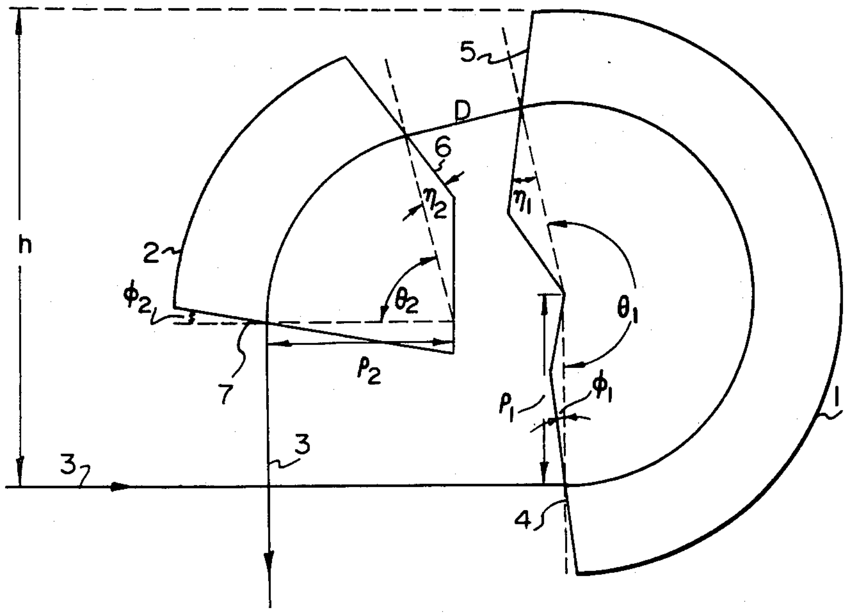
FIG. 1 schematically illustrates the magnetic beam deflection system in accordance with the present invention.

The magnetic beam deflection system in accordance with the present invention is described in conjunction with FIG. 1. All edge angles, $\phi_1$, $\phi_2$, $\eta_1$ and $\eta_2$, shown on FIG. 1 are by convention defined to be positive in sign. The system includes two approximately parallel faced dipole magnets 1 and 2 which are utilized to deflect a charged particle beam 3, such as an electron beam, from an accelerator along paths having substantially constant bending radii $\eta_1$ and $\eta_2$ which may be similar. The first magnet 1 deflects the beam through an angle $\theta_1$. Its entry edge 4 is at an angle $\phi_1$ to a line perpendicular to the beam 3 while its exit edge 5 is at an angle $\eta_1$ to a line perpendicular to the path.

The second magnet 2 entry edge 6 is positioned at a drift distance D with respect to the magnet 1 exit edge 5. Magnet 2 deflects the beam through an angle $\theta_2$. Its entry edge 6 is substantially parallel to the exit edge 5, and its exit edge 7 is at an angle $\phi_2$ to a line perpendicular to the beam path 3. The entry and exit edges 4, 5, 6 and 7 shown by solid lines in FIG. 1 are conventionally known as the SCOFF edges which are the effective sharp cut-off edges of a dipole magnet as determined by the fringing magnetic fields of that magnet.

Since magnet 1 bends the beam through an angle at or greater than 180°, $2\rho_1$ is the beam orbit height, h, for the system. This orbit is kept to a minimum since the beam 3, once it leaves magnet 1, is not projected upward.

Figure 3:
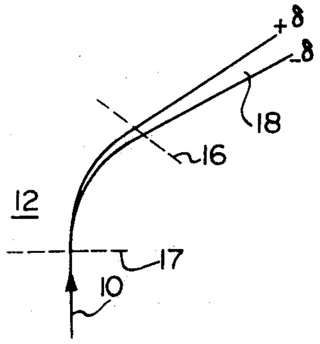
FIG. 3 schematically illustrates the effect of a bending magnet deflection of less than 90° on a charged particle beam.
Figure 2:
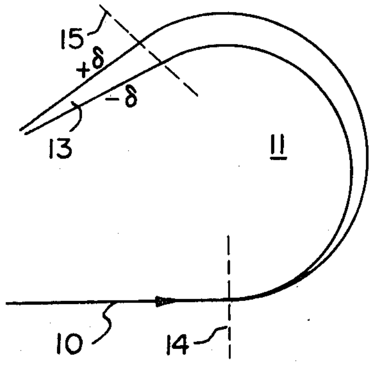
FIG. 2 schematically illustrates the effect of a bending magnet deflection of greater than 180° on a charged particle beam.

FIGS. 2 and 3 serve to elucidate the principle by which double achromaticity is achieved. When on-axis, zero divergence, pencil beam 10 with a fractional energy spread $\pm\delta$, is injected into a dipole magnet 11 having entry and exit edges 14 and 15 for deflecting the beam more than 180°, the output beam 13 will be convergent as shown schematically is FIG. 2. When a similar beam 10 is injected into a dipole magnet 12 of opposite polarity having entry and exit edges 17 and 16 for deflecting the beam less than 90° deflection, the output beam 18 will be divergent as shown schematically in FIG. 3.

The magnetic beam deflection system in FIG. 1 combines these two effects by:

(1) matching the convergence angle produced by magnet 11 with the divergence angle produced by magnet 12; and (2) choosing the appropriate distance D between the magnets such that the rays with fractional energy spread $\pm\delta$ overlap exactly in the region between the dipole magnets 11 and 12.

Both the matching of the ray angles and the calculation of the correct separation distance D for overlop is readily accomplished in the following manner:

The rate of change of beam angle with beam energy at the exit from the first magnet 11 is $$\frac{d\,\theta_B}{d\delta} = -[\sin\theta_1 + (1-\cos\theta_1)\tan\eta_1] \quad (1)$$

For a beam injected in the reverse direction into the second magnet 12 with its polarity reversed, the rate of change of beam angle with beam energy is given by $$\frac{d\,\theta_B}{d\delta} = -[\sin\theta_2 + (1-\cos\theta_2)\tan\eta_2] \quad (2)$$

To produce a doubly achromatic system of two magnets 11 and 12 of the same polarity, the two rates of change of angle with energy must be made equal in magnitude and opposite in sign. As well, the dispersion of the two magnets 11 and 12 must be matched across the drift region. This is accomplished by choosing the drift distance D between the effective SCOFF edges of the magnets 11 and 12 according to:

$$D = \frac{\rho_1(1-\cos\theta_1) - \rho_2(1-\cos\theta_2)}{\left.\frac{d\,\theta_B}{d\delta}\right]_{1st\ Magnet}} \quad (3)$$

In the case where $\eta_2=\eta_1$, then $$D = \rho_1\frac{(\cos\theta_2 - \cos\theta_1)}{\left.\frac{d\,\theta_B}{d\delta}\right]_{1st\ Magnet}} \quad (3')$$

Note that both $\cos\theta_2$ and $(-\cos\theta_1)$ are positive numbers in the range of values possible for this magnet.

Although the basic principle of double achromaticity is not dependent upon the interior edges 15 and 16 being parallel, in practice the axial focusing in the direction perpendicular to the bending plane required to maintain the beam within a practical magnet gap size is achieved only when the angle $\eta_1$ is approximately equal to minus $\eta_2$. That is, the interior edges are approximately parallel.

$$\eta_1 \simeq -\eta_2 \quad (4)$$

If, to simplify analytical calculations, one puts the interior angles $\eta_1$ and $\eta_2$ equal and opposite, then the first order equations are simplified and the constraint which matches the ray angles becomes $$\theta_2 - \eta_2 = \left(\frac{\theta_T - 180^\circ}{2}\right)$$

or $$2\theta_2=\theta_2-(\theta_1-180^\circ) \quad (5)$$

where $$\theta_T=\theta_1+\theta_2 \quad (6)$$

is the total bending angle of the magnet. In the instance of a 270° bending magnet, the constraint on the angles becomes $$\theta_2-\eta_2=45^\circ \quad (7)$$

and for $\rho_2=\rho_1$ the separation distance between the SCOFF edges becomes $$D = \rho_1\frac{(1+\cos 2\eta_2)}{\left(1+\frac{\sin\eta_2}{\sin 45^\circ}\right)} = \rho_1\frac{2\cos^2\eta_2}{(1+1.414\sin\eta_2)} \quad (8)$$

A specific example of a 270° magnet system of the form shown in FIG. 1 where $\rho_2=\rho_1$ is as follows:

$\theta_1=193^\circ$ (beam deflection angle in magnet 1)
$\theta_2=77^\circ$ (beam deflection angle in magnet 2)
$\eta_1=-32^\circ$ (magnet 1 exit edge angle)
$\eta_2=32^\circ$ (magnet 2 entry edge angle)
$D=0.822\,\rho_1$ (drift distance between interior SCOFF edges 5 and 6)
$g=0.2\,\rho_1$ (pole gap spacing)

All of the above formulae are based on the sharp cut-off edge approximation and first order magnet optics. In the complete design of a magnet system, one would usually include extended fringing field and second order effects which produce small modifications of the central orbit parameters, of the conditions for double achromaticity and of the spatial focusing properties in a manner known and understood by those familiar with the art of magnets, as exemplified in the publications, "Calculations of Properties of Magnetic Deflection Systems", S. Penner, Rev. Sci. Instr. 32, 150, 1961; "Effect of Extended Fringing Fields on Ion-Focusing Properties of Deflecting Magnets", H. A. Enge, Rev. Sci. Instr. 35, 278, 1964; and "Focusing for Dipole Magnets with Large Gap to Bending Radius Ratios", E. A. Heighway, N.I.M.123, 413, 1975; which are incorporated herein by reference.

The largest modifying effect in this example is that of the extended fringing fields in the space between the magnets. This is because, in the present very compact bending magnet system, the pole gap spacing, g, is an appreciable fraction of the mean bending radius. Consequently, the fields bulge into the region between the poles and in fact, the fields from the two poles overlap somewhat, so that there is, in reality, no field free drift region between the actual poles. Correcting for this effect in first order calculations may be accomplished by using either TRANSPORT (a Stanford Linear Accelerator Laboratory Report SLAC-91, incorporated herein by reference), a ray tracing program, or any other program for designing charged particle beam transport systems, generally known in the art.

One simple method to calculate the modifying effects of the overlapping extended fringing field distribution is to assume a suitably chosen constant magnetic field in the drift region and to increase the separation of the SCOFF edges so that the integral of the magnetic field along the beam path is the same as for the actual field. This produces a modification of the doubly achromatic conditions such that the previous example becomes, using first order magnet optics, $\theta_1=197.3°$
$\theta_2=60.0°$
$\eta_1=-32°$
$\eta_2=32°$
$D=1.19\ \rho_1$ (distance between the now modified interior SCOFF edges 5 and 6)
$g=0.2\ \rho_1$ If these calculations are extended to include second order effects, then the optimized operating design will depend upon the input beam properties and to a small extent on a quadrupole doublet which may be used to match the input beam spatial characteristics to the magnet focusing properties. Inclusion of a magnetic quadrupole at the input to the two magnet system broadens the range of spatial focusing properties without affecting the double achromaticity significantly.

Figure 4:
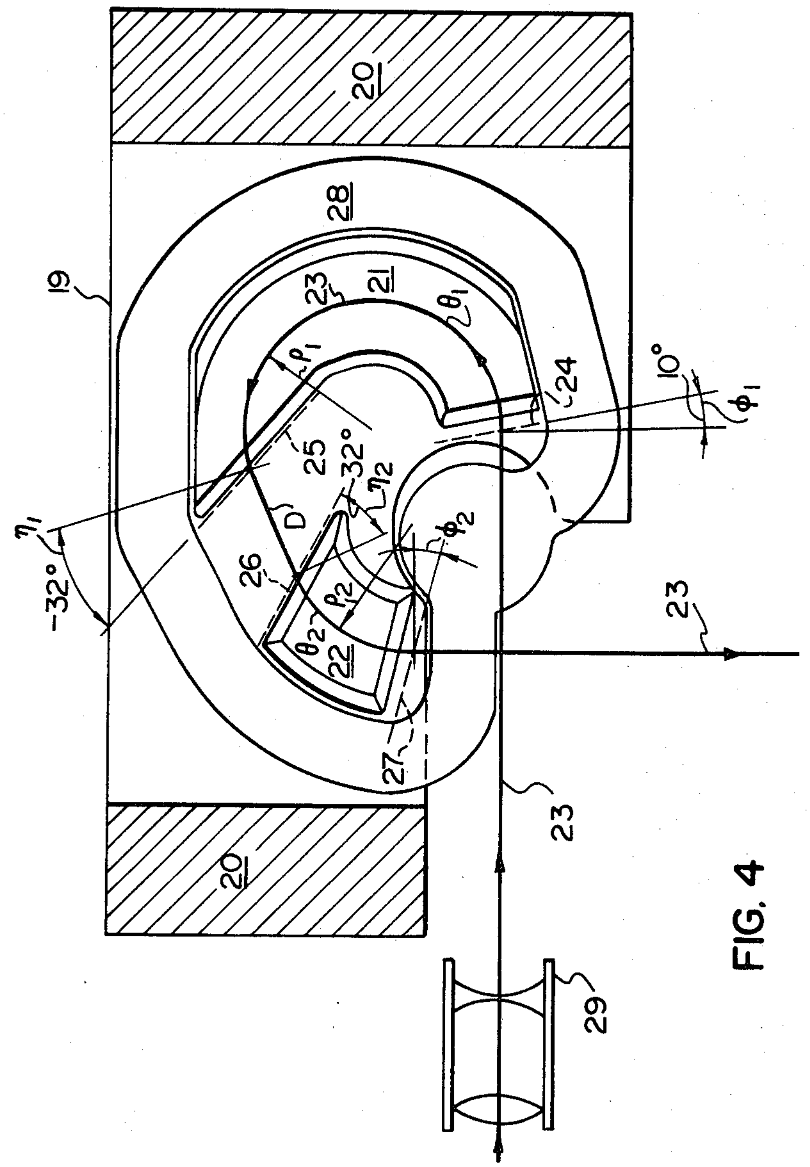
FIG. 4 illustrates one embodiment of the magnetic beam deflection system including a quadrupole doublet for changing the spatial focusing properties.

FIG. 4 illustrates, in a plan view cross-section taken along the beam path plane, an example of a magnet system in accordance with the present invention. This system is designed to accept and focus onto a target, a cylindrically symmetric 25 MeV beam 23, characterized by a 0.2 cm radius, 100 cm upstream from the quadrupole, a maximum divergence angle of ±2.5 milliradians and an energy spread of ±10%.

The system includes an electromagnet with side yokes 19, end yokes 20 shown cross-hatched, and with dipole faces 21 and 22. The dipole faces 21 and 22 have chamfered edges in the conventional manner. As discussed above, the fringe fields at the pole edges are considerable in such a small system, and, therefore, the effective or SCOFF edges do not correspond with the actual pole edges, the SCOFF edges 24, 25, 26 and 27 respectively, are shown as broken lines adjacent to the actual edges. The system is energized by coils 28 slipped over the poles such that the coil plane is parallel to the beam path plane. In addition, a quadrupole doublet 29 shown schematically may be used to condition the beam 23 for the bending magnet system.

This magnet system has been optimized to second order for a bending radius $\rho_1=\rho_2$ of 7.0 cm and a pole face gap, g, of 1.4 cm. The parameters for the system are as follows:

$\theta_1=197.6°$
$\theta_2=59.7°$
$\eta_1=-32.0°$
$\eta_2=32.0°$
$\phi_1=10.0°$
$\phi_2=15.0°$
$D=7.38$ cm.—The actual pole face separation along the beam path being in the order of 0.3 cm greater.

Many modifications in the above described embodiments of the invention can be carried out without departing from the scope thereof and, therefore, the scope of the present invention is intended to be limited only by the appended claims.

I claim:

1. A magnetic charged particle beam deflection system comprising:

first dipole magnet means for deflecting the beam in a plane along a path having a bending radius $\rho_1$ and a bending angle $\theta_1$ greater than 180° and less than 225°, said first magnet means having an effective exit edge at an angle $(90-\eta_1)$ with respect to the beam path at exit; and second dipole magnet means for further deflecting the beam in the plane along a path having a bending radius $\rho_2$ and a bending angle $\theta_2$ of less than 90°, the second magnet means having an effective entry edge at an angle $(90-\eta_2)$ with respect to the beam path, where $\eta_1 \approx -\eta_2$, and the first magnet means effective exit edge being a drift distance D from the second magnet means effective entry edge, wherein D is selected to match the first and second dipole magnet means dispersions in the drift region D.

2. A magnetic beam deflection system as claimed in claim 1 wherein $225° < (\theta_1+\theta_2) < 280°$.

3. A magnetic beam deflection system as claimed in claim 2 wherein $2\eta_2 \approx \theta_2-(\theta_1-180°)$.

4. A magnetic beam deflection system as claimed in claims 1, 2 or 3 wherein $\rho_2=\rho_1$.

5. A magnetic beam deflection system as claimed in claim 1 for deflecting the beam through an angle in the order of 270° wherein $\rho_2=\rho_1$ and $$D \approx \rho_1 \frac{(1+\cos 2\eta_2)}{\left(1+\frac{\sin \eta_2}{\sin 45°}\right)}.$$

6. A magnetic beam deflection system as claimed in claim 5 wherein $\theta_2-\eta_2 \approx 45°$.

* * * * *

UNITED STATES PATENT AND TRADEMARK OFFICE

CERTIFICATE OF CORRECTION

PATENT NO. : 4,389,572

DATED : June 21, 1983

INVENTOR(S) : Ronald M. Hutcheon

It is certified that error appears in the above-identified patent and that said Letters Patent is hereby corrected as shown below:

Column 2, Line 11: Correct "$\eta_2 \approx \eta_1$" to read -- $\eta_2 \approx -\eta_1$ --.

Column 3, Line 45: Correct "$\eta_2 = \eta_1$" to read -- $\rho_2 = \rho_1$ --.

Signed and Sealed this

Fifth Day of October, 1993

*Attest:*

BRUCE LEHMAN

*Attesting Officer*

*Commissioner of Patents and Trademarks*